United States Patent [19]
Sato

[11] Patent Number: 5,315,146
[45] Date of Patent: May 24, 1994

[54] SEMICONDUCTOR MEMORY DEVICE HAVING SPECIFIC LAYOUT CONFIGURATION OF N-MOS MEMORY CELLS

[75] Inventor: Yoshihide Sato, Tokorozawa, Japan

[73] Assignee: Fujitsu Limited, Kanagawa, Japan

[21] Appl. No.: 33,577

[22] Filed: Mar. 18, 1993

[30] Foreign Application Priority Data

Mar. 19, 1992 [JP] Japan ................... 4-063990

[51] Int. Cl.$^5$ ............ H01L 27/10; H01L 27/15; H01L 27/02
[52] U.S. Cl. .................. 257/390; 257/401; 257/903; 257/904
[58] Field of Search ............ 257/368, 390, 401, 903, 257/904

[56] References Cited

U.S. PATENT DOCUMENTS 4,322,824 3/1982 Allan ........................ 257/904

FOREIGN PATENT DOCUMENTS

57-210664 12/1982 Japan ......................... 257/904
58-50770 3/1983 Japan ......................... 257/904
59-51563 3/1984 Japan ......................... 257/903

Primary Examiner—Ngan Ngo
Attorney, Agent, or Firm—Armstrong, Westerman, Hattori, McLeland & Naughton

[57] ABSTRACT

A semiconductor memory device includes a gate region of each driver transistor arranged obliquely with respect to a first direction of a chip; a source/drain region of each driver transistor arranged obliquely with respect to the first direction; contact windows arranged substantially straight with respect to the first direction and connecting each source/drain region of the driver transistors to a power supply line provided in the first direction; and contact windows arranged every one contact window in a zigzag manner with respect to the first direction and connecting each source/drain region of transfer gate transistors to a corresponding bit line. By the constitution, it is possible to reduce an area of memory cell regions resulting in a reduction in a chip area, and to cause respective driver transistors to have uniform characteristics and thus improve an operation reliability thereof.

9 Claims, 9 Drawing Sheets

SEMICONDUCTOR MEMORY DEVICE HAVING SPECIFIC LAYOUT CONFIGURATION OF N-MOS MEMORY CELLS

BACKGROUND OF THE INVENTION

1. Field of the Invention

The present invention relates to a semiconductor memory device. More particularly, it relates to a layout configuration of n-MOS memory cells, each being constituted using n-channel MOS transistors, which are arranged in the form of a matrix in a semiconductor memory device.

2. Description of the Related Art

Generally, in a semiconductor memory device, a plurality of memory cells are arranged in a matrix along row and column directions on a chip. In the arrangement form, each memory cell typically includes a flip-flop having two sets of driver transistors and load elements which are cross-coupled, and a pair of transfer gate transistors connected between a pair of data retaining nodes of the flip-flop and a pair of complementary bit lines, respectively. Also, regions of power supply lines for feeding power to the respective memory cells are incorporated into the above arrangement, together with regions of the memory cells.

In such a layout configuration, for example, where a further power supply line is arranged in the matrix of memory cells, a problem may be posed. Namely, since a layout pattern for the power supply line generally has no common portion with respect to a layout pattern of the memory cells, it is necessary to take the trouble to make or devise the layout pattern for the power supply line. This work is troublesome.

Also, depending on the arrangement form of each memory cell or the communization form of contact windows between each source/drain of the driver transistors or the transfer gate transistors and the power supply line or the bit lines, a problem occurs in that the entire chip area is increased by a wiring region corresponding to the power supply line.

To prevent an increase in the chip area, for example, an approach to reduce a distance between patterns of the complementary bit lines can be proposed. However, where the distance between the bit lines is simply reduced, respective regions (gate, source, drain) constituting each transistor may be changed in shape, depending on the arrangement form of the memory cells or the communization form of the contact windows. In this case, the gate width or the gate length of each transistor is changed and thus the characteristics thereof are also changed. This leads to a lowering in the operation reliability.

Note, the problems in the prior art will be explained later in detail in contrast with the preferred embodiments of the present invention.

SUMMARY OF THE INVENTION

An object of the present invention is to provide a semiconductor memory device which can reduce an area of memory cell regions resulting in a reduction in a chip area, while causing respective driver transistors to have uniform characteristics and thus improving an operation reliability thereof.

Another object of the present invention is to provide a semiconductor memory device which can prevent the entire chip area from being increased even if a power supply line is arranged in the column direction in the matrix of memory cells.

Basically, the above objects are attained by devising or improving a layout configuration of the transistor portions in each memory cell. Also, where a power supply line is arranged in the column direction in the matrix of memory cells, one of the above objects is attained by utilizing a pattern having a partially identical configuration with respect to the pattern of memory cells.

Therefore, according to the present invention, there is provided a semiconductor memory device including a plurality of memory cells arranged in a matrix on a chip, each memory cell including a flip-flop having two sets of driver transistors and load elements which are cross-coupled, and a pair of transfer gate transistors connected between a pair of data retaining nodes of the flip-flop and a pair of complementary bit lines, respectively, and responsive to a potential at a corresponding word line, the semiconductor memory device comprising: a gate region of each driver transistor arranged obliquely with respect to a first direction of the chip; a source/drain region of each driver transistor arranged obliquely with respect to the first direction; contact windows arranged substantially straight with respect to the first direction and connecting each source/drain region of the driver transistors to a power supply line provided in the first direction; and contact windows arranged every one contact window in a zigzag manner with respect to the first direction and connecting each source/drain region of the transfer gate transistors to the corresponding bit line.

In a preferred aspect of the present invention, the gate region of each driver transistor and the corresponding source/drain region are arranged to cross at substantially right angles with each other.

Also, the semiconductor memory device may further comprise a region for a power supply line arranged in a second direction perpendicular to the first direction in the matrix of memory cells, the region being set to be the same width as that of a column pitch between adjacent memory cells, wherein the memory cell arrangement is made to communize a contact window between adjacent memory cells provided to sandwich the region for a power supply line therebetween.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Throughout the description, identical references used in connection with the drawings indicate like constituent elements and thus the repetition of explanation thereof is omitted. Also, in the description below, the term "transistor" indicates an n-channel MOS transistor so long as a specific definition is not added thereto.

First, for a better understanding of the preferred embodiment, the related prior art will be explained with reference to FIGS. 1 to 5.

Figure 1:
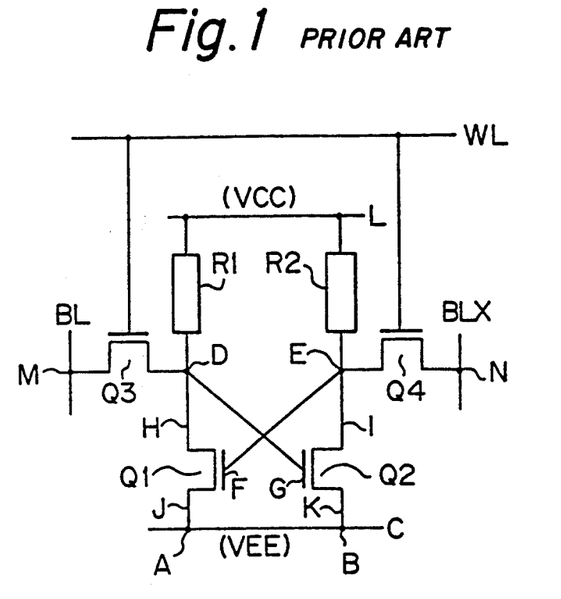
FIG. 1 is a circuit diagram showing a constitution of a typical n-MOS memory cell.

FIG. 1 illustrates a circuit constitution of a typical n-MOS memory cell.

The illustrated memory cell includes a flip-flop having two sets of driver transistors Q1, Q2 and load elements R1, R2 which are cross-coupled between a higher voltage power supply line VCC and a lower voltage power supply line VEE, and a pair of transfer gate transistors Q3, Q4 connected between a pair of data retaining nodes of the flip-flop and a pair of complementary bit lines BL, BLX, respectively, and turned ON and OFF in response to a potential at a word line WL to thereby effect a data transmission therebetween.

Figure 2:
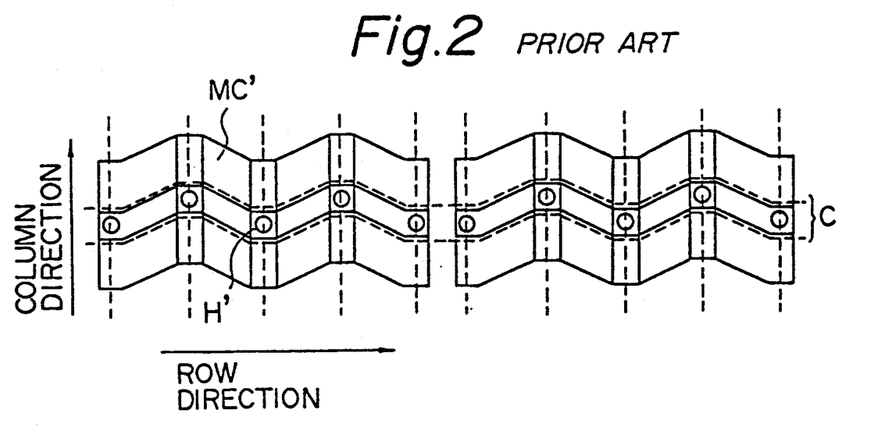
FIG. 2 is a view schematically showing an arrangement form of each memory cell in a prior art.

FIG. 2 schematically shows an arrangement form of each memory cell in a prior art.

In the illustration, reference MC' denotes a region corresponding to one memory cell; reference C denotes a power supply line provided in the row direction, which corresponds to a portion indicated by reference C in FIG. 1; and reference H' denotes a contact window between each memory cell MC' and the power supply line C. As shown in FIG. 2, each memory cell in respective rows is arranged every one cell in a zigzag manner with respect to the row direction.

Figure 3:
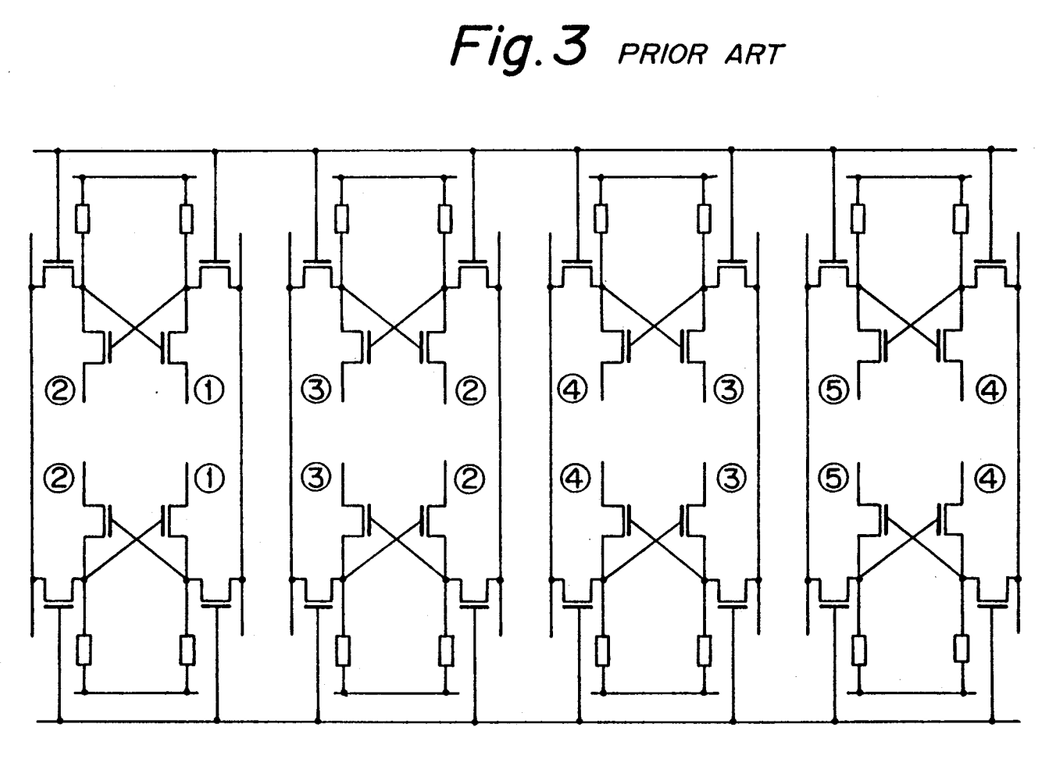
FIG. 3 is a view showing a communization form of the contact windows between each source of the driver transistors and the power supply line provided in the row direction in the arrangement form of FIG. 2.

FIG. 3 illustrates a communication form of the contact windows between each source of the driver transistors (Q1, Q2) and the power supply line (VEE) provided in the row direction in the arrangement form of FIG. 2.

In the illustration, portions indicated by an identical numeral (for example, ① and ①, ② and ②, . . . . . . ) are connected to each other via a common contact window.

Figure 4:
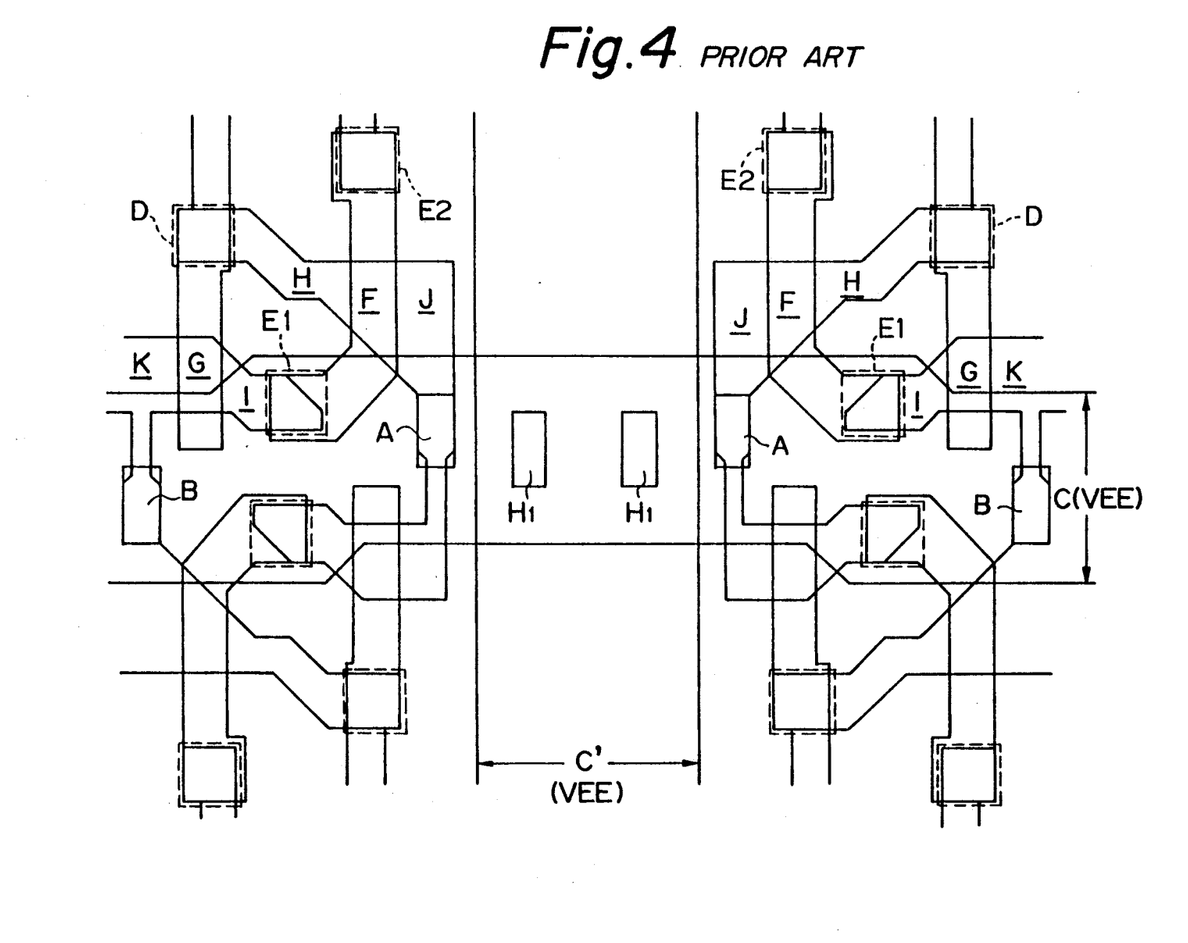
FIG. 4 is a view schematically showing a portion of the layout pattern made based on the arrangement form of FIG. 2.

FIG. 4 schematically illustrates a portion of the layout pattern made based on the arrangement form of FIG. 2.

In the illustration, respective regions indicated by references A to K correspond to each portion in the n-MOS memory cell shown in FIG. 1, respectively. Note, respective patterns of the transfer gate transistors Q3, Q4 and the load elements R1, R2 are omitted for simplification of the illustration. References J, F and H denote a source, a gate and a drain of the transistor Q1, respectively; references K, G and I denote a source, a gate and a drain of the transistor Q2, respectively; reference A denotes a contact window between the source J of the transistor Q1 and the power supply line C provided in the row direction; reference B denotes a contact window between the source K of the transistor Q2 and the power supply line C; reference D denotes a contact window between the drain H of the transistor Q1 and the gate G of the transistor Q2; and references E1, E2 denote contact windows (corresponding to a contact window E) between the drain I of the transistor Q2 and the gate F of the transistor Q1. Also, reference C' denotes a power supply line (VEE) provided in the column direction, and reference H1 denotes a contact window between the power supply line C provided in the row direction and the power supply line C' provided in the column direction.

According to the configuration of the layout pattern of FIG. 4, where a power supply line is arranged in the column direction in the matrix of memory cells, it is impossible to communize the contact windows (A, B in FIG. 4) between the power supply line (C in FIG. 4) provided in the row direction and each source (J, K in FIG. 4) of the respective driver transistors in adjacent memory cells provided to sandwich the power supply line (C' in FIG. 4) therebetween on both sides of the power supply line. Namely, it is necessary to provide the contact windows A, B on both sides of the power supply line (C'), respectively. As a result, a disadvantage occurs in that a distance between the adjacent memory cells must be fully secured by a region corresponding to the width of the power supply line (C').

Thus, where a power supply line is provided in the column direction in the prior art arrangement form of memory cells, a problem arises in that it is necessary to take the trouble to make a layout pattern for the power supply line, which has no common portion with respect to the layout pattern of the memory cells, and thus the entire chip area is increased by a wiring region corresponding to the power supply line concerned.

Figure 5:
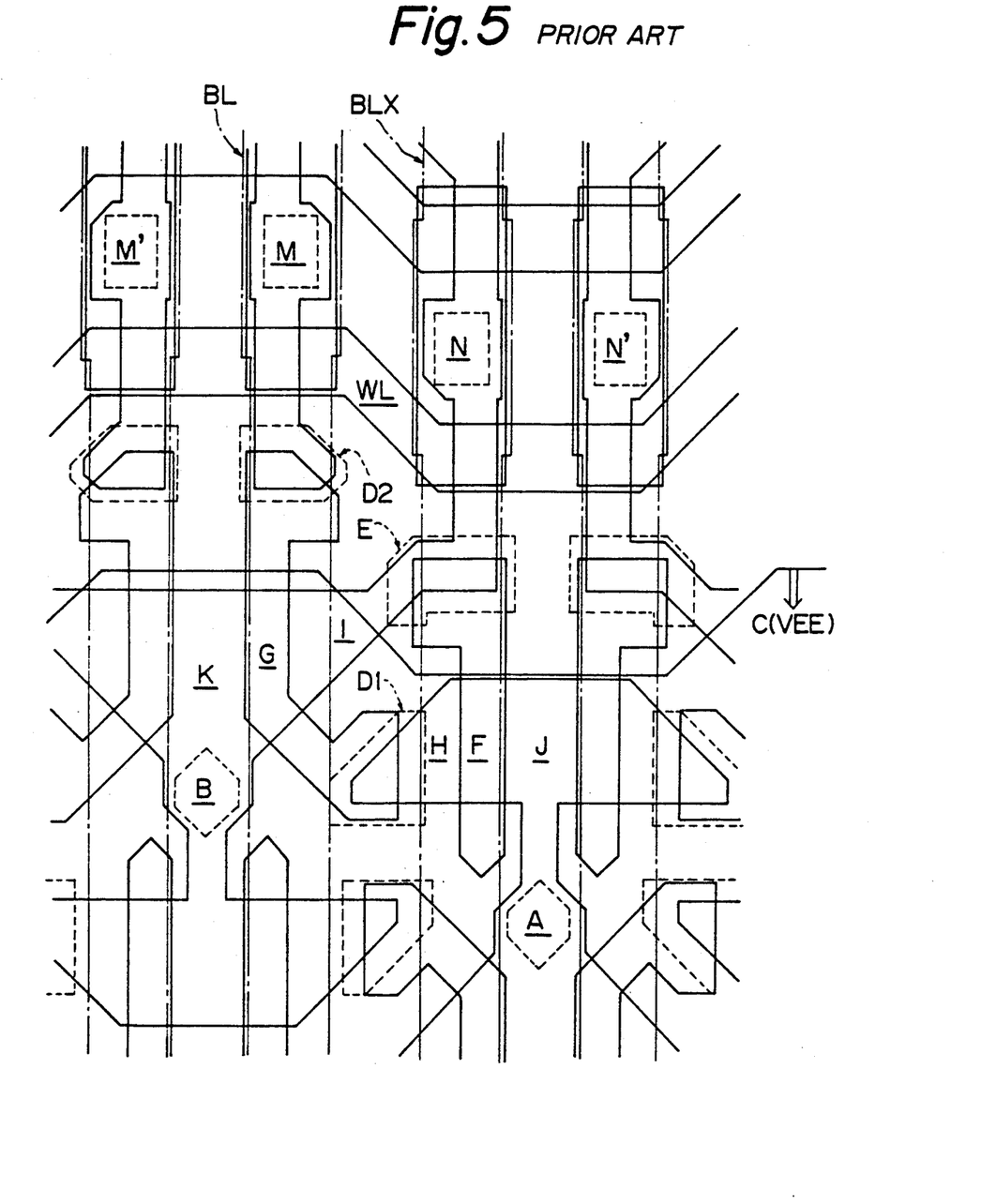
FIG. 5 is a view schematically showing another portion of the layout pattern made based on the arrangement form of FIG. 2.

FIG. 5 schematically illustrates another portion of the layout pattern made based on the arrangement form of FIG. 2.

In the illustration, respective regions indicated by references A to K, M, N, BL, BLX and WL correspond to each portion in the n-MOS memory cell shown in FIG. 1, respectively. Note, respective patterns of the load elements R1, R2 are omitted for simplification of the illustration. References D1, D2 denote contact windows (corresponding to a contact window D) between the drain H of the transistor Q1 and the gate G of the transistor Q2. Also, references M, N denote contact windows between each source of the pair of transfer gate transistors Q3, Q4 and the pair of bit lines BL, BLX, respectively. In this connection, references M', N' denote corresponding contact windows in the adjacent memory cell.

According to the configuration of the layout pattern of FIG. 5, the contact windows between each source of the transfer gate transistors and the complementary bit lines are arranged every two contact windows (M and M', N and N') in a zigzag manner with respect to the row direction, the two contact windows belonging to different memory cells adjacent to each other. Also, the contact windows (A, B) between each source of the driver transistors and the power supply line C are arranged every one contact window in a zigzag manner with respect to the row direction. Accordingly, where an approach to reduce an area of memory cell regions is taken in the above layout configuration, it is most suitable to reduce a distance between patterns of the complementary bit lines BL, BLX belonging to an identical memory cell.

When the distance between the bit lines BL, BLX is simply reduced, however, respective regions constituting the driver transistors (K, G, I, J, F, H) are changed or distorted in shape, as is obvious from the layout configuration of FIG. 5. As a result, the gate width or the gate length of each driver transistor is changed and thus the characteristics thereof are also changed. This leads to a lowering in the operation reliability and thus is not preferable.

Figure 6:
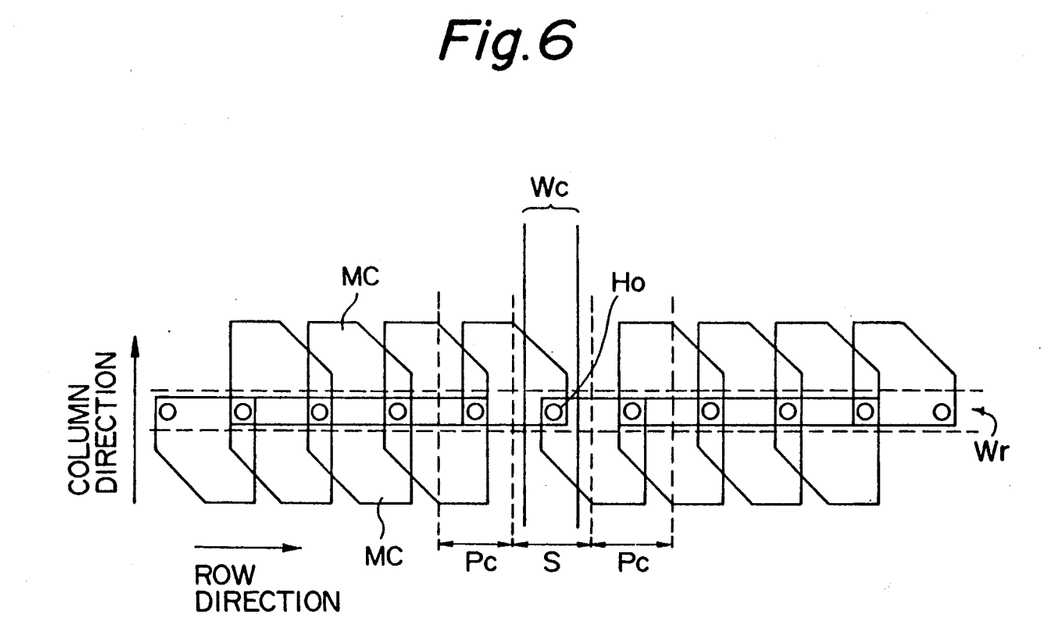
FIG. 6 is a view schematically showing an arrangement form of each memory cell in the semiconductor memory device according to an embodiment of the present invention.

FIG. 6 schematically shows an arrangement form of each memory cell in the semiconductor memory device according to an embodiment of the present invention.

In the illustration, reference MC denotes a region corresponding to one memory cell; reference Pc denotes a column pitch between adjacent memory cells; reference Wc denotes a power supply line provided in the column direction; and reference S denotes a region containing the power supply line Wc. In the present embodiment, although the region S is set to have the same width as that of the column pitch Pc, it is not restrictive. Also, reference Wr denotes a power supply line provided in the row direction; and reference $H_0$ denotes a contact window between the power supply line Wr and each source (stated later) of the driver transistors in respective memory cells. Note, a concrete layout pattern made based on the illustrated arrangement form will be explained later.

According to the arrangement form of FIG. 6, each memory cell in respective rows is arranged substantially straight with respect to the row direction. Concretely, each memory cell in one of the respective rows is arranged to be oriented to the same direction, and to communize the contact windows $H_0$ between the power supply line Wr provided in the row direction and each source of the respective driver transistors therein. Also, two adjacent rows are arranged such that each memory cell in one row and each memory cell in another row are oriented to opposite directions, and such that they communize the contact window $H_0$ between the power supply line Wr (row direction) and each source of the respective driver transistors in adjacent memory cells provided to sandwich the power supply line Wc (column direction) therebetween.

Figure 7:
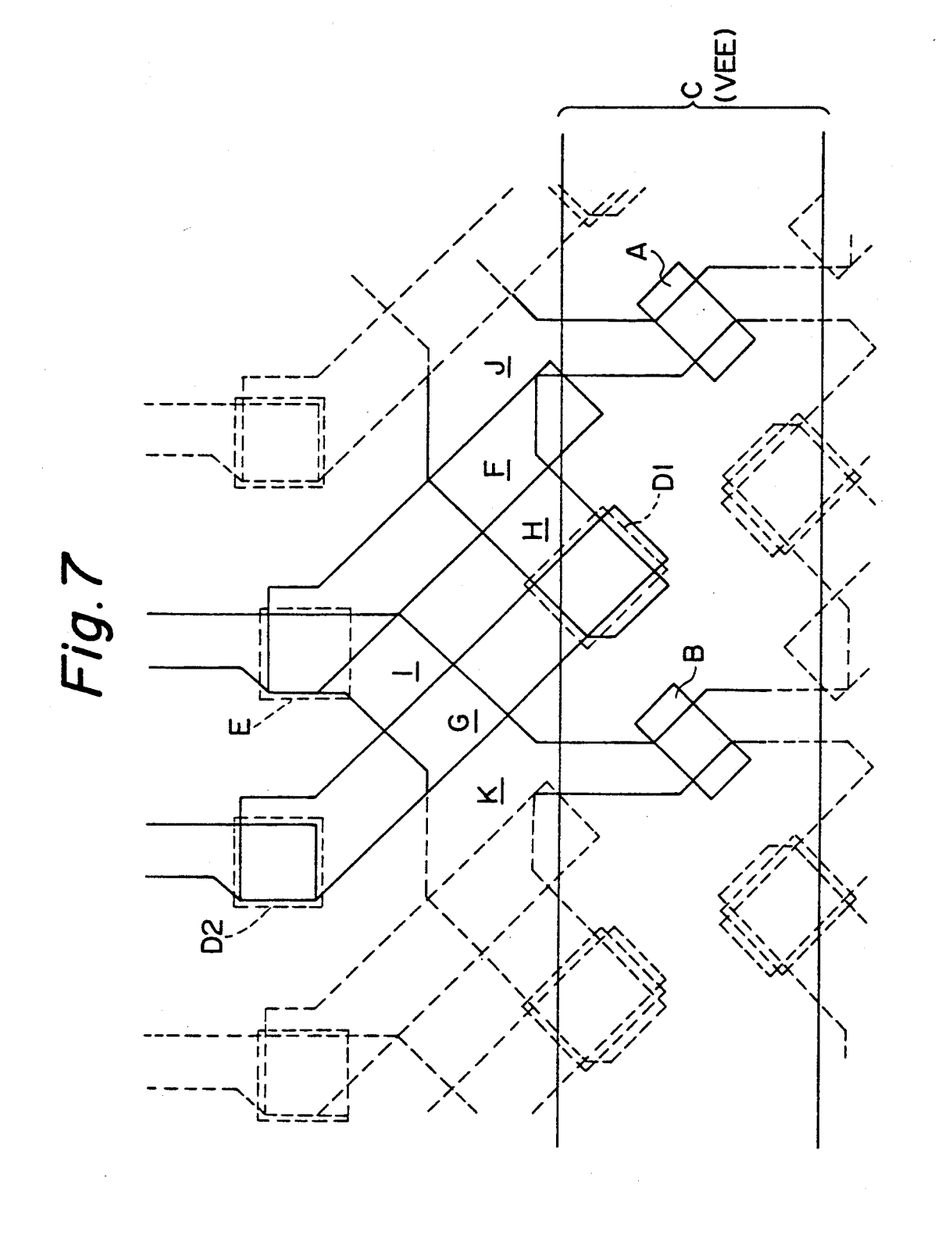
FIG. 7 is a view schematically showing a layout pattern of the driver transistor portions in each memory cell shown in FIG. 6.

FIG. 7 schematically illustrates a layout pattern of the driver transistor portions in each memory cell shown in FIG. 6.

In the illustration, respective regions indicated by references A to K correspond to each portion in the n-MOS memory cell shown in FIG. 1. Respective correspondences are the same as those in FIG. 4, and thus the explanation thereof is omitted. Note, references D1, D2 denote contact windows (corresponding to a contact window D) between the drain H of the transistor Q1 and the gate G of the transistor Q2. Also, the illustrated power supply line C corresponds to the power supply line Wr provided in the row direction shown in FIG. 6.

As is obvious from comparison of the present embodiment (FIG. 7) with the prior art (FIG. 4), arrangement or configuration of the layout pattern (A to K) of the driver transistor portions in each memory cell is changed or improved. By the improvement of the layout pattern, the present embodiment enables the arrangement to communize the contact window between the adjacent memory cells provided to sandwich the power supply line Wc (column direction) therebetween.

Figure 8:
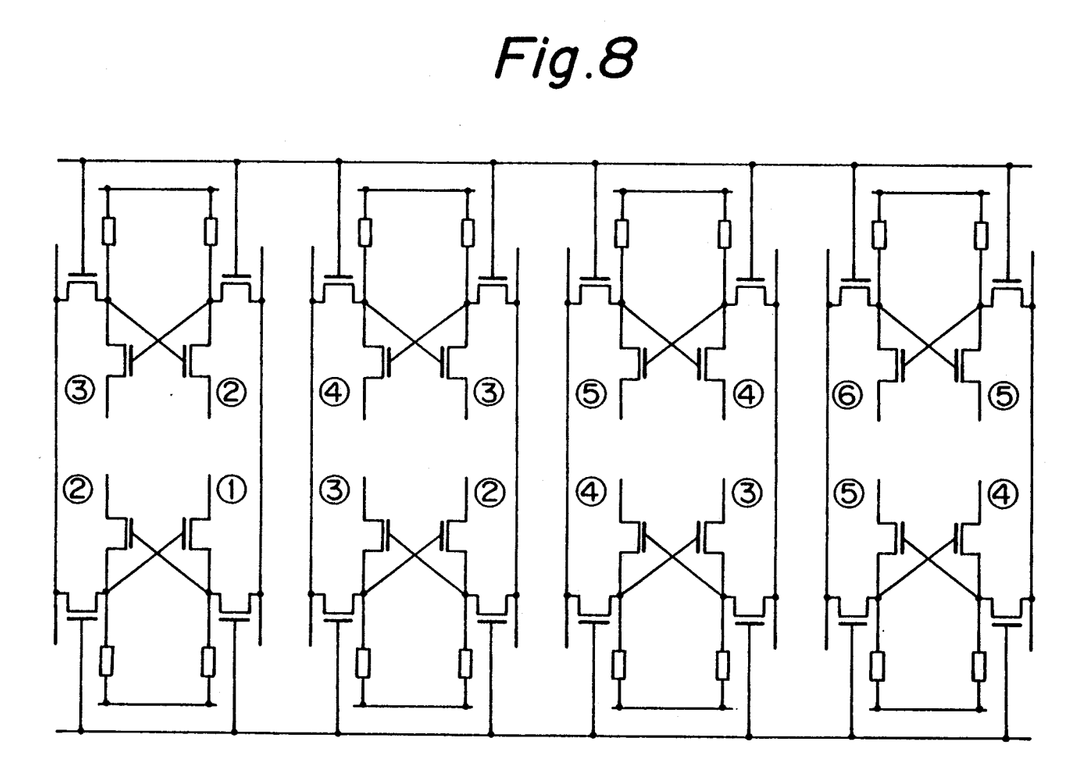
FIG. 8 is a view showing a communization form of the contact windows between each source of the driver transistors and the power supply line provided in the row direction in the arrangement form of FIG. 6.

FIG. 8 illustrates a communization form of the contact windows between each source of the driver transistors and the power supply line provided in the row direction in the arrangement form of FIG. 6.

Likewise as in FIG. 3, portions indicated by an identical numeral (for example, ①and ①, ②and ②, ... ...) are connected to each other via a common contact window.

Figure 9:
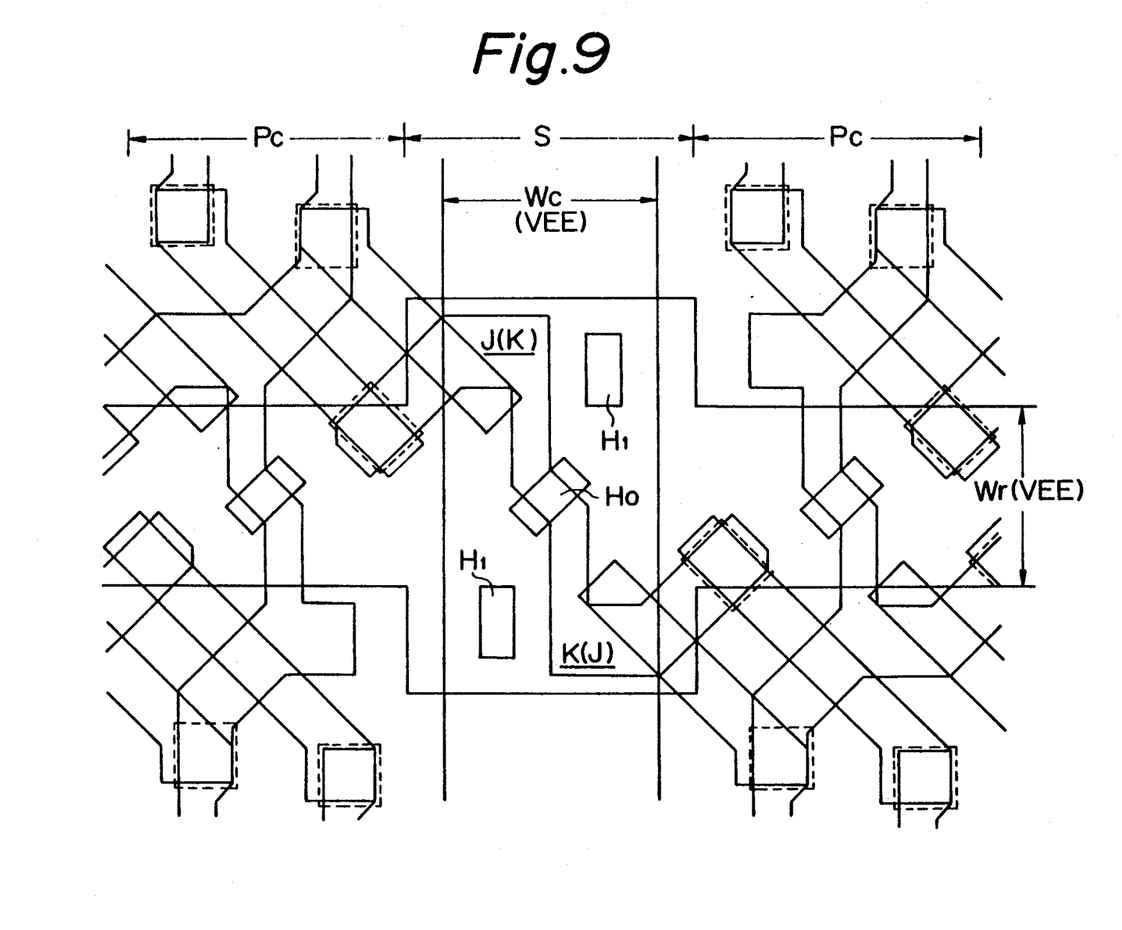
FIG. 9 is a view schematically showing a portion of the layout pattern made based on the arrangement form of FIG. 6.

FIG. 9 schematically illustrates a portion of the layout pattern made based on the arrangement form of FIG. 6.

In the illustration, reference $H_1$ denotes a contact window between the power supply line Wr provided in the row direction and the power supply line Wc provided in the column direction. As shown in FIG. 9, the contact window $H_0$ is communized between the power supply line Wr provided in the row direction and each source (portion indicated by reference J or K) of the respective driver transistors in the adjacent memory cells provided to sandwich the region S of the power supply line Wc provided in the column direction therebetween. Likewise as in FIG. 4, respective patterns of the transfer gate transistors (Q3, Q4) and the load elements (RI, R2) are omitted for simplification of the illustration.

Note, although not shown in FIG. 9, the number of memory cells per one row in the region sandwiched by two adjacent power supply lines Wc provided in the column direction is four or eight in the preferred example.

Thus, according to the configuration of the layout pattern of FIG. 9, where a power supply line (Wc) is arranged in the column direction in the matrix of memory cells, the power supply line Wc is provided in the region S having the same width as that of the column pitch Pc such that it has a partially identical layout pattern with respect to the layout pattern of the memory cells, and the memory cell arrangement is made to communize the contact window $H_0$ between the adjacent memory cells provided to sandwich the power supply line Wc therebetween. As a result, it is possible to remove a disadvantage, as seen in the prior art, in that the chip area is increased due to the arrangement of the power supply line concerned (Wc). Namely, it is possible to realize a reduction in the entire chip area including the memory cell regions and the power supply line regions.

Figure 10:
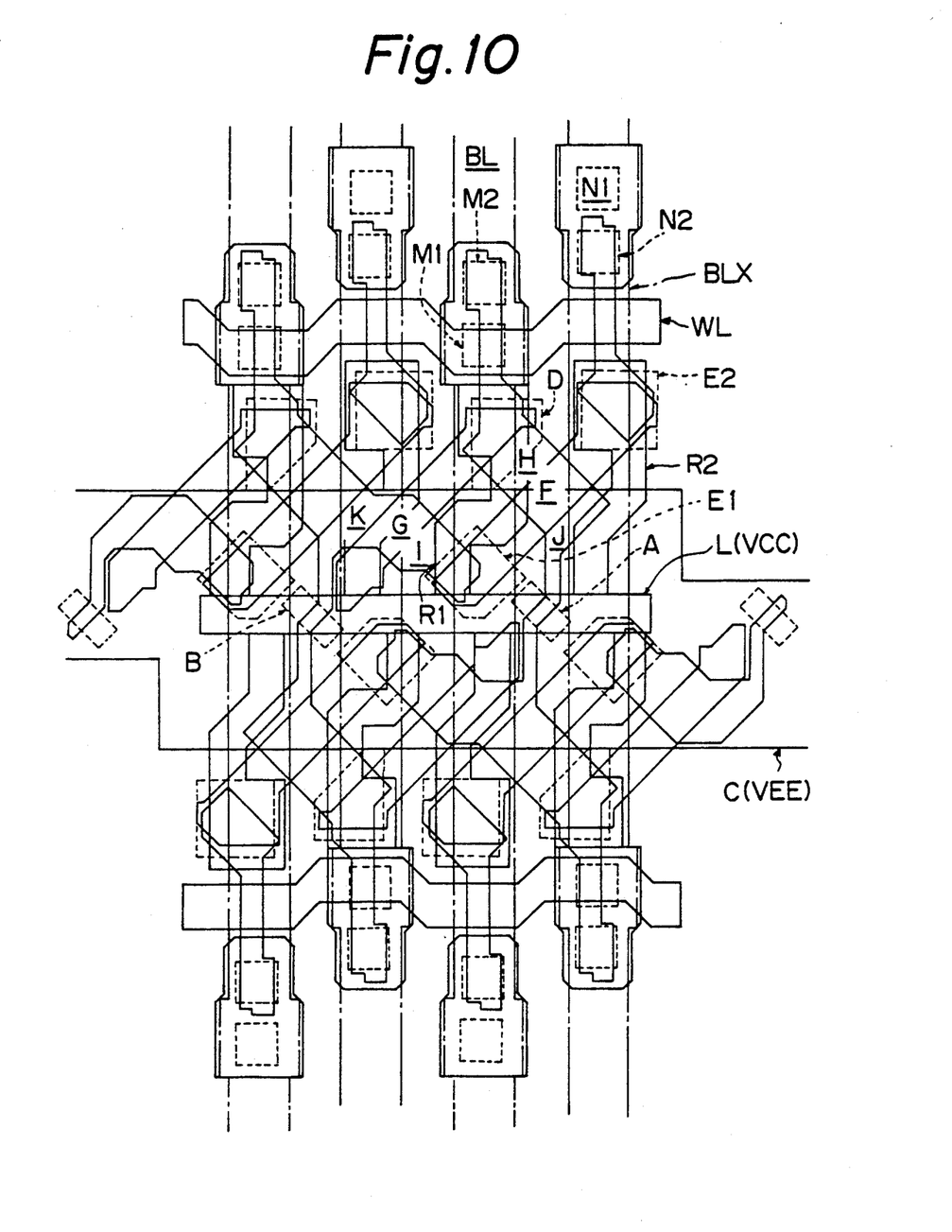
FIG. 10 is a view schematically showing another portion of the layout pattern made based on the arrangement form of FIG. 6.

FIG. 10 schematically illustrates another portion of the layout pattern made based on the arrangement form of FIG. 6. Note, the illustration is shown symmetrically with respect to the column direction, compared with the illustration of FIG. 7.

In the illustration, respective regions indicated by references A to K, L, M1, M2, N1, N2, R1, R2, BL, BLX and WL correspond to each portion in the n-MOS memory cell shown in FIG. 1, respectively. Note, references E1, E2 denote contact windows (corresponding to a contact window E) between the drain I of the transistor Q2 and the gate F of the transistor Q1. Also, references M1, N1 denote contact windows between an intermediate wiring layer and the bit lines BL, BLX, respectively, and references M2, N2 denote contact windows between the intermediate wiring layer and each source of the transfer gate transistors (Q3, Q4), respectively. Accordingly, the contact windows M1 and M2 correspond to a contact window M shown in FIG. 1, and the contact windows N1 and N2 correspond to a contact window N therein.

According to the configuration of the layout pattern of FIG. 10, the contact windows (M1, M2; N1, N2) between each source of the transfer gate transistors and the complementary bit lines are arranged every one contact window in a zigzag manner with respect to the row direction, while the contact windows (A, B) between each source of the driver transistors and the power supply line C are arranged substantially straight with respect to the row direction. In this connection, the gate region (e.g., region indicated by F) and the source/drain region (e.g., region indicated by J, H) in the respective driver transistors are provided obliquely with respect to the row direction (or the column direction), respectively, and arranged to cross at substantially right angles with each other. The gate region of each driver transistor and the corresponding source/drain region are provided such that the relationship of arrangement of the crossing therebetween is made constant irrespective of a distance between adjacent bit lines (BL, BLX).

Thus, even if the distance between the adjacent bit lines is reduced for reduction of an area of memory cell regions, it is possible to maintain the gate width or the gate length of each driver transistor in a constant state. As a result, each driver transistor can have a uniform characteristic. This contributes to an improvement in the operation reliability. Also, since the relationship of arrangement of the crossing between each gate region and the corresponding source/drain region is made constant, an advantage is obtained when an exposure processing is carried out in the manufacturing of the device. Namely, it is possible to exactly effect the exposure because of the regular arrangement of gate patterns and source/drain patterns.

Although the present invention has been disclosed and described by way of one embodiment, it is apparent to those skilled in the art that other embodiments and modifications of the present invention are possible without departing from the spirit or essential features thereof.

I claim:

1. A semiconductor memory device including a plurality of memory cells arranged in a matrix on a chip, each memory cell including a flip-flop having a first set of one driver transistor and one load element, and a second set of one driver transistor and one load element, said first and second sets being cross-coupled, and a pair of transfer gate transistors connected between a pair of data retaining nodes of the flip-flop and a pair of complementary bit lines, respectively, and responsive to a potential at a corresponding word line, the semiconductor memory device comprising:
   a gate region of each driver transistor arranged obliquely with respect to a first direction of the chip;
   a source/drain region of each drive transistor arranged obliquely with respect to the first direction of the chip;
   first contact windows arranged in a line substantially parallel with the first direction and connecting each source/drain region of the driver transistors to a power supply line provided in the first direction; and
   second contact windows arranged every one contact window in a zigzag manner with respect to the first direction and connecting each source/drain region of the transfer gate transistors to the corresponding bit line.

2. A semiconductor memory device as set forth in claim 1, wherein the gate region of each driver transistor and the corresponding source/drain region are arranged to cross at substantially right angles with each other.

3. A semiconductor memory device as set forth in claim 2, wherein the gate region of each driver transistor and the corresponding source/drain region are provided such that the relationship of arrangement of the crossing therebetween is made constant irrespective of a distance between adjacent bit lines.

4. A semiconductor memory device as set forth in claim 2, further comprising:
   a region for a power supply line arranged in a second direction perpendicular to the first direction in the matrix of memory cells, the region being set to be the same width as that of a column pitch between adjacent memory cells,
   wherein the memory cell arrangement is made to communize a contact window between adjacent memory cells so as to provide the region for a power supply line therebetween.

5. A semiconductor memory device as set forth in claim 4, wherein the power supply line arranged in the second direction has a partially identical layout pattern with respect to a layout pattern of the memory cells.

6. A semiconductor memory device as set forth in claim 4, wherein each memory cell in respective rows provided in the first direction is arranged substantially straight with respect to the first direction.

7. A semiconductor memory device as set forth in claim 6, wherein each memory cell in one of the respective rows is arranged to be oriented to the same direction, and to communize contact windows between each source of the respective driver transistors and the power supply line provided in the first direction.

8. A semiconductor memory device as set forth in claim 7, wherein two adjacent rows are arranged such that each memory cell in one row and each memory cell in another row are oriented to opposite directions, and such that the memory cell in one row and the memory cell in another row communize a contact window between the power supply line of the first direction and each source of the respective driver transistors in adjacent memory cells so as to provide the power supply line of the second direction therebetween.

9. A semiconductor memory device as set forth in claim 1, wherein each of the plurality of memory cells is an n-MOS memory cell.

* * * * *